United States Patent
Ryan et al.

(10) Patent No.: US 11,863,362 B2
(45) Date of Patent: Jan. 2, 2024

(54) MATCHED FILTER BANK

(71) Applicant: Nordic Semiconductor ASA, Trondheim (NO)

(72) Inventors: Daniel Ryan, Trondheim (NO); Wei Li, Trondheim (NO)

(73) Assignee: Nordic Semiconductor ASA, Trondheim (NO)

( * ) Notice: Subject to any disclaimer, the term of this patent is extended or adjusted under 35 U.S.C. 154(b) by 0 days.

(21) Appl. No.: 17/988,602

(22) Filed: Nov. 16, 2022

(65) Prior Publication Data

US 2023/0072942 A1   Mar. 9, 2023

Related U.S. Application Data

(63) Continuation of application No. 17/050,244, filed as application No. PCT/EP2019/060539 on Apr. 24, 2019, now Pat. No. 11,533,207.

(30) Foreign Application Priority Data

Apr. 25, 2018   (GB) ...................................... 1806730

(51) Int. Cl.
*H03H 11/02*       (2006.01)
*H04L 27/233*      (2006.01)
(Continued)

(52) U.S. Cl.
CPC ..... *H04L 27/2334* (2013.01); *H03H 17/0254* (2013.01); *H04L 27/2338* (2013.01); *H04L 27/2671* (2013.01)

(58) Field of Classification Search
CPC ............. H04L 27/2334; H04L 27/2338; H04L 27/2671; H03H 17/0254
(Continued)

(56) References Cited

U.S. PATENT DOCUMENTS

2003/0099313 A1   5/2003   Li et al.
2004/0042535 A1   3/2004   Mayor et al.
(Continued)

FOREIGN PATENT DOCUMENTS

GB        2512935 A       10/2014
WO    WO 2014/167318 A2   10/2014
(Continued)

OTHER PUBLICATIONS

Arne Svenssson, A Class of reduced-complexity viterbi detectors for partial response continuous phase modulation, IEEE Transaction on communications, vol. com-32 (Year: 1984).*

(Continued)

*Primary Examiner* — Tanmay K Shah
(74) *Attorney, Agent, or Firm* — Klarquist Sparkman, LLP

(57) ABSTRACT

A radio receiver comprises a matched filter bank and a decision unit. The matched filter bank has a plurality of filter modules for generating correlation-strength data from a sampled radio signal, each filter module being configured to cross-correlate the sampled signal with data representing a respective filter sequence. The decision unit is configured to use the correlation-strength data to generate a sequence of decoded symbols from the sampled signal. The matched filter bank and/or decision unit are configured to determine the value of each symbol in the sequence in part based on the value of a respective earlier decoded symbol from the sequence of decoded symbols.

20 Claims, 5 Drawing Sheets

(51) Int. Cl.
*H03H 17/02* (2006.01)
*H04L 27/26* (2006.01)

(58) Field of Classification Search
USPC .......................................................... 375/350
See application file for complete search history.

(56) References Cited

U.S. PATENT DOCUMENTS

| 2006/0182210 A1* | 8/2006 | Miller | H04L 1/0048 |
| | | | 375/349 |
| 2010/0061492 A1 | 3/2010 | Noeldner | |
| 2012/0163509 A1* | 6/2012 | Nemeth | H04L 25/067 |
| | | | 375/340 |
| 2013/0156132 A1 | 6/2013 | Ozgur | |

FOREIGN PATENT DOCUMENTS

| WO | WO 2014/167318 A3 | 10/2014 |
| WO | WO 2019/134947 A9 | 7/2019 |

OTHER PUBLICATIONS

International Search Report and Written Opinion for PCT/EP2019/060539, dated Sep. 24, 2019, 15 pages.
IPO Search Report under Section 17(5) for GB1806730.6, dated Sep. 28, 2018, 3 pages.
Perrins et al., "Optimal and Reduced Complexity Receivers for M-ary Multi-h CPM," *Wireless Communications and Networking Conference*, Mar. 2014, pp. 1165-1170.
Svensson et al., "A Class of Reduced-Complexity Viterbi Detectors for Partial Response Continuous Phase Modulation," *IEEE Transactions on Communications*, vol. COM-32, No. 10, Oct. 1984, pp. 1079-1087.
Svensson, "Reduced State Sequence Detection of Partial Response Continuous Phase Modulation," *IEEE Proceedings I. Solid-State & Electron Devices*, Institution of Electrical Engineers, vol. 138, No. 4, Aug. 1991, pp. 256-268.
Extended European Search Report for corresponding European Patent Application No. 23169622.0-1206, dated Jul. 4, 2023, 9 pages.
Perrins et al., Optimal and Reduced Complexity Receivers for M-ary Multi-h CPM, 2004 *IEEE Wireless Communications and Networking Conference*, Mar. 2004, pp. 1165-1170.
Piat-Durozoi et al., "Multisymbol with Memory Noncoherent Detection of CPFSK," *2017 IEEE International Conference on Acoustics, Speech and Signal Processing*, Mar. 2017, pp. 3794-3798.
Svensson et al., "A Class of Reduced-Complexity Viterbi Detectors for Partial Response Continuous Phase Modulation," *IEEE Transactions on Communications*, vol. 32, No. 10, Oct. 1984, pp. 1079-1087.
Svensson, "Reduced state sequence detection of partial response continuous phase modulation," *IEEE Proceedings-I, Communications, Speech and Vision*, vol. 138, Issue 4, Aug. 1991, pp. 256-268.

\* cited by examiner

| k | b0,b1,b2 | $F_{-2}$ | $F_{-1}$ | Current output F |
|---|---|---|---|---|
| 0 | 000 | 0 | 0 | 0 |
| 1 | 001 | 0 | 0 | 1 |
| 2 | 010 | 0 | 1 | 0 |
| 3 | 011 | 0 | 1 | 1 |
| 4 | 100 | 1 | 0 | 0 |
| 5 | 101 | 1 | 0 | 1 |
| 6 | 110 | 1 | 1 | 0 |
| 7 | 111 | 1 | 1 | 1 |

Figure 5

| $F_{-2}$ | $F_{-1}$ | $I_1$ | $I_0$ |
|---|---|---|---|
| 0 | 0 | $I_1^0$ | $I_0^0$ |
| 0 | 1 | $I_1^1$ | $I_0^1$ |
| 1 | 0 | $I_1^0$ | $I_0^2$ |
| 1 | 1 | $I_1^1$ | $I_0^3$ |

Figure 6

MATCHED FILTER BANK

CROSS REFERENCE TO RELATED APPLICATIONS

This is a continuation applications of U.S. patent application Ser. No. 17/050,244, filed Oct. 23, 2020, which is the U.S. National Stage of International Application No. PCT/EP2019/060539, filed Apr. 24, 2019, which was published in English under PCT Article 21(2), which in turn claims the benefit of Great Britain Application No. 1806730.6, filed Apr. 25, 2018. All of the above applications are incorporated by reference herein.

This invention relates to methods and apparatus for decoding digital radio transmissions.

In digital radio communication a transmitted radio signal typically comprises a carrier wave, centred on a particular frequency, which is modulated to encode a stream of digital "0"s and "1"s. A radio receiver converts the incoming analogue waveform into a sequence of discrete bits in order to recover the transmitted message.

However, digital radio signals are subject to noise which can cause uncertainty as to whether any particular received bit should be decoded as a digital "0" or "1".

One known method for deducing a bit sequence from a received phase-encoded or frequency-encoded digital radio signal is to generate complex baseband samples from the signal, and input these to a matched filter bank. A matched filter bank (MFB) comprises a set of filters, each of which cross-correlates the received signal with a respective template waveform, corresponding to a fixed sequence of one or more data bits. For example, a filter bank may contain thirty-two filters, each corresponding to a respective waveform representing a different sequence of five bits; together, the MFB covers all $2^5$ bit sequences. Bit decisions can then be made in blocks of five, determining which filter gives the strongest match to the waveform, in any given time interval, and decoding the block as the bit sequence corresponding to the strongest filter.

WO 2014/167318, by the present applicant, addresses the problem of noise by considering multiple observations of each particular received bit position, in overlapping time windows. For a particular bit, there will be as many observations as the common filter length—e.g., five observations for each bit with a 5-bit filter length. Whether a particular bit should be decoded as a 0 or a 1 is then determined based on a majority vote over the set of binary values that the multiple observations provide for that bit position.

In general, increasing the bit-length, K, of each filter will increase the sensitivity of such a receiver, such that values of K=5, K=7, or higher, are desirable. However, increasing the bit-length requires an exponential increase in the number of filters. For a non-coherent matched filter bank of length K bits, the number of multiply-accumulate operations is $O(K.R.2^K)$, where R is an oversampling rate. For a hardware-implemented radio (e.g., a radio-on-a-chip), such exponential growth in complexity means that K cannot be increased without significantly increasing the area and power consumption of the demodulator. This is undesirable, especially on a power-constrained device, such as a battery-powered Bluetooth™, LTE-M or NB-IoT devices.

The present invention seeks to provide an alternative approach for increasing the sensitivity of MFB-based radio receivers.

From a first aspect, the invention provides a method of decoding data from a radio signal, the method comprising:

- applying a matched filter bank to a sampled radio signal to generate correlation-strength data, wherein each filter in the matched filter bank cross-correlates the sampled signal with data representing a respective filter sequence; and
- using the correlation-strength data to generate a sequence of decoded symbols from the sampled signal wherein the value of each symbol in the sequence of decoded symbols is determined in part based on the value of a respective earlier decoded symbol from the sequence of decoded symbols.

From a second aspect, the invention provides a radio receiver comprising:

- a matched filter bank comprising a plurality of filter modules for generating correlation-strength data from a sampled radio signal, each filter module being configured to cross-correlate the sampled signal with data representing a respective filter sequence; and
- a decision unit configured to use the correlation-strength data to generate a sequence of decoded symbols from the sampled signal, wherein the matched filter bank and/or decision unit are configured to determine the value of each symbol in the sequence in part based on the value of a respective earlier decoded symbol from the sequence of decoded symbols.

Thus it will be seen by those skilled in the art that, in accordance with the invention, the value of a previously-decoded symbol is used to influence the decoding of a current symbol. This can effectively increase the length of the received signal that is used to demodulate the current symbol, resulting in greater sensitivity, without having to increase the number of filters. This is because the value of the earlier decoded symbol will typically be affected by samples in the sampled signal that precede the earlier decoded symbol up to the length of the filter sequences, so then using this decoded symbol to determine the decoding of a later symbol allows these earlier samples also to influence the decoding the later symbol even though these sample may be separated from the later symbol by more the length of the filter sequences.

Each filter sequence is preferably two symbols or more in length. In some embodiments, one symbol is simply equal to one bit. The filter sequences may be binary filter sequences. However, in other embodiments, a symbol may convey two or more bits of information.

The filter sequences may all have a common length, K symbols. K may equal 2, 3, 4, 5, 7 or any positive integer.

In any of the embodiments, for each symbol in the sequence of decoded symbols (the most recently-calculated of which may conveniently be referred to as the "current" symbol), the respective earlier decoded symbol may be offset from said symbol in time by a time offset, which may be constant (e.g., a constant number of symbol intervals). In some embodiments, this offset may have a value between one symbol and one less than a length of a filter sequence—e.g., in the range [0, K−1]—such that the current symbol and the respective earlier symbol are always within a filter's length, K, of each other. In other embodiments, the offset may be equal to or greater than the length of the filters, K.

In some embodiments, the value of each symbol in the sequence of decoded symbols may be determined in part based on the values of a plurality of respective earlier decoded symbols from the sequence of decoded symbols. These earlier decoded symbols may be offset from the current symbol by respective time offsets, which may be constant over time. These earlier decoded symbols may comprise or consist of a run of successive symbols, i.e., with the offsets being a set of consecutive integers. In some embodiments, the offsets may all be in the range [0, K−1], such that each earlier symbol is within a filter's length, K, of the current symbol. However, in other embodiments, at least some of the offsets may be equal to or greater than the filter length, K.

The value(s) of the earlier decoded symbol (or symbols) may be fed back from an output of the decision unit along one or more feedback paths. The feedback path may be a single line for communicating a single bit value. A feedback path may lead to a buffer (e.g., a shift register) for storing the value of the earlier decoded symbol. The buffer may have a length equal to the number of earlier decoded symbols that the receiver is configured to use when determining the value of each symbol. A feedback path may lead to a control input of a selector (e.g., a multiplexer) for selecting one value (e.g., an intermediate calculation result) from a plurality of stored values for input to a calculation in the matched filter bank (e.g., as input to a filter cross-correlation module) or as input to an operation in the decision unit (e.g., as input to a majority vote block in the decision unit).

In a first set of embodiments, the value(s) of the earlier decoded symbol (or symbols) is used in the matched filter bank, while in a second set of embodiments, the value of the earlier decoded symbol is used in the decision unit. (These two sets of embodiments are not necessarily distinct, and may overlap.)

In the first set of embodiments, the value(s) of the earlier decoded symbol (or symbols) is used in the matched filter bank. The matched filter bank may be configured to receive, as input, the value(s) of the earlier decoded symbol(s). It may include the value(s) in each filter sequence.

Each filter sequence may comprise, or consist of, a constant portion and a variable portion. The variable portion may be positioned before the constant portion—i.e., corresponding to earlier-received samples in the sampled signal. The constant portions may have a common length, C, which may be 1 symbol, 2 symbols, 3 symbols, 4 symbols, 5 symbols, 7 symbols or more. Across the bank of filters, the constant portions may contain every integer value from zero to the number of filters minus one—e.g., representing values from 0 to $2^C-1$, where C is a common length of the constant portions of the filter sequences measured in bits. The variable portions may all have a common length, V. The total length of each filter may then be K=V+C. In some embodiments, V=C−1; for example, C=3 and V=2, giving a total filter length K=5. However, any appropriate values of C and V may be used. In general, for a given total sequence length, K, increasing C and reducing V may result in greater performance, but at the cost of higher complexity; increasing K may give improved performance, but less robustness to frequency error and modulation-index error. Appropriate values may be selected for any given context. In general, these filter parameters will be fixed (i.e., hard-wired), although it is possible they could be variable in some embodiments (e.g., in a DSP or FPGA implementation).

At each symbol-interval time step, the variable portions, across the filter bank, may all be identical (i.e., of equal value). The variable portions may depend on, or comprise, the earlier decoded symbol or symbols. Each variable portion may consist of a sequence of earlier decoded symbols, in the order in which they were decoded. In this first set of embodiments, the filter bank may cross-correlate the sampled signal with filter sequences that are K symbols long, while only containing $S^C$ filters, where C<K, and S is the order of each symbol (e.g., S=2 for binary decoding). Each symbol in the sequence of decoded symbols could potentially be decoded by applying the filter bank once, for each symbol, and identifying the best-matched filter, and decoding the symbol as the corresponding value in the best-matched filter. However, in other embodiments, the matched filter bank may be applied to the sampled signal a plurality of times, with different time offsets, when decoding each symbol. The decision unit may comprise a hard symbol decision block, such as a majority-vote detector, which may receive a best-matched filter for each time offset; it may decode the value of a particular (e.g., "current") symbol position in the decoded sequence by applying a decision process to the respective plurality of symbol values, for the particular symbol position, from across the plurality of best-matched filters. Alternatively, it may comprise a soft symbol decision block.

In the second set of embodiments, the value of the earlier decoded symbol is used in the decision unit. In these embodiments, the filter bank may be conventional—i.e., it may contain $2^K$ filters, each of which cross-correlates the sampled signal with a different filter sequence K symbols long. The earlier decoded symbol may be used in the decision unit such that a filter cross-correlation operation can influence a decoded symbol that is received later than the samples that are involved in the filter cross-correlation operation. In particular, the decision unit may be configured to use the correlation-strength data to identify a plurality of matched filter sequences for a common length of sampled signal, equal to the filter length—e.g., two or more filter sequences, rather than just one best-matched filter sequence. Each of the matched filter sequences may be a best-matched filter sequence to the sampled signal out of a respective subset of the filter sequences. Each subset may contain all the filter sequences that have a respective common value at a particular symbol position in the filter sequence, or that have respective common values at a plurality of predetermined symbol positions in the filter sequence. The plurality of matched filter sequences represent different hypotheses for what the eventual value(s) of these predetermined symbol position(s) will be, in the sequence of decoded symbol values, once this value(s) has been determined. Once this value has been decoded, the decision unit may then use this value (being the "earlier decoded symbol"), to select one or more of the matched filter sequences that has this earlier decoded symbol value in the corresponding symbol position. The decision unit may then decode a particular symbol, received after the earlier decoded symbol, by inputting the selected sequence or sequences to a hard symbol decision process, such as a majority-vote detector, or to a soft decision process. The decision process may also receive one or more sequences corresponding to one or more further observations of the same particular symbol at a different time offset.

Traditionally, if the filter sequences are all of length K, with K>1, each filter would be applied K times to each symbol position in the sampled signal (at K different time offsets). This would normally yield K best-matched filter sequences for each symbol position, to which a decision unit could apply a majority-voting process, to determine a value of the corresponding decoded symbol in the sequence of decoded symbols. By contrast, in this second set of embodiments, the decision unit may identify more than K matched filter sequences in the process of decoding a particular symbol position—for instance, in a binary decoding process, the identities of $\Sigma_{k=0}^{K-1} 2^k$ matched filter sequences may be used by the decision logic when decoding one bit.

The received radio signal may be a phase- or frequency-modulated radio signal—e.g., modulated using binary frequency-shift keying (BFSK), continuous-phase frequency-shift keying (CPFSK), Gaussian frequency-shift keying (GFSK), minimum-shift keying (MSK), differential phase-shift keying (DPSK), offset quadrature phase-shift keying (OQPSK), or continuous phase modulation (CPM). The radio signal may be modulated in amplitude as well as phase and/or frequency—e.g., using quadrature amplitude modulation (QAM). In one set of embodiments, the signal is modulated using GFSK with a carrier frequency around 2.4 GHz. The radio signal may be a Bluetooth™ or Bluetooth™ Low Energy signal.

The radio receiver may be an integrated radio receiver—e.g., a silicon chip. (It will be appreciated that the radio receiver may nevertheless require one or more off-chip components to be connected to the radio receiver for it to operate, such as a power supply, antenna, crystal, discrete capacitors, discrete resistors etc.). The radio receiver may also comprise a radio transmitter.

The radio receiver may comprise one or more processors, DSPs, logic gates, amplifiers, filters, digital components, analogues components, non-volatile memories (e.g., for storing software instructions), volatile memories, memory bus systems, peripherals, inputs, outputs, or any other appropriate electronic components. The radio receiver may comprise circuitry for performing timing, phase or frequency correction operations.

While the matched filter bank could potentially be implemented in software (e.g., on a software-defined radio), in a preferred set of embodiments it is implemented in hardware—e.g., using a digital logic circuit. Each filter module may comprise a plurality of logic gates, separate from any general-purpose processor in the radio receiver. Each filter module may share a common design—e.g., differing only in the data that is stored in one or more registers when the receiver is in use.

In the second set of embodiments, each filter module may be hardwired to cross-correlate the sampled signal with a fixed filter sequence, or with a fixed plurality of filter sequences. In the second set of embodiments, the receiving may have a respective filter module for each possible filter sequence of a particular length.

The data representing the filter sequence may be stored, e.g., in ROM, or it may be generated inherently as part of a cross-correlation calculation. The data may represent the respective filter sequence modulated using the same modulation scheme with which the received radio signal is modulated.

The filters in the matched filter bank may all have a common symbol length. This length may be even, but is preferably odd, which can simplify the implementation of a majority-voting detector located downstream from the matched filter block.

The radio signal may be processed in any appropriate way, in the analogue or digital domains, before being input to the matched filter bank as the sampled radio signal. The sampled radio signal may be at baseband. The radio receiver may comprise a mixer for down-converting the received radio signal—e.g., to an intermediate frequency below the carrier frequency. The radio receiver may comprise an analogue-to-digital converter for generating the sampled radio signal. The samples in the sampled signal may comprise a sequence of quadrature (I & Q) values. Each symbol may be oversampled in the sampled signal—e.g., having eight samples for each symbol or bit.

The MFB may be applied to the sampled signal repeatedly, at discrete time steps. Each time step may equal one symbol period in the sampled signal. The matched filter bank may perform the cross-correlation operations at a rate equal to the symbol rate of the received radio signal (i.e., in real time), which may be while the radio signal is being received by the radio receiver.

It will be appreciated that it may not be possible to apply the decoding techniques described herein to the first few symbols in a received transmission, because there will be no "earlier decoded symbols" for these initial symbols. However, once an initial buffer of decoded symbols has been filled, the process of using one or more earlier decoded symbols to assist in decoding a later symbol can commence, and potentially continue until the end of the transmission is reached.

The decision unit may comprise a hard symbol decision block, which may be a majority-vote block. This hard symbol decision block may output the sequence of decoded symbols. It may receive, as input, a plurality of filter sequences, each containing a respective candidate value for a common symbol position in the sequence of decoded symbols. (Receiving a filter sequence may comprise receiving data that indexes or otherwise represents a particular filter sequence.) It may apply any suitable decision process to the candidate values, such as a majority vote or a weighted vote, to determine a decoded value for the symbol position. Alternatively, the decision unit may comprise a soft symbol decision block; this may use respective correlation-strength data from a plurality of matched filters to decode a symbol.

At any stage, data representing an intermediate or final value or result may be stored in a memory (e.g., a shift register or RAM). The sequence of decoded symbols may be output from the decision unit to a volatile or non-volatile memory of the radio receiver.

Features of any aspect or embodiment described herein may, wherever appropriate, be applied to any other aspect or embodiment described herein. Where reference is made to different embodiments or sets of embodiments, it should be understood that these are not necessarily distinct but may overlap.

Certain preferred embodiments of the invention will now be described, by way of example only, with reference to the accompanying drawings, in which:

FIG. 5 is a table showing how the filter indices map to decoded bit sequences, according to the decision unit of FIG. 4; and FIG. 6 is a table showing how the feedback selector in the decision unit of FIG. 4 affects the filter indices that are input to the majority vote block.

Figure 1:
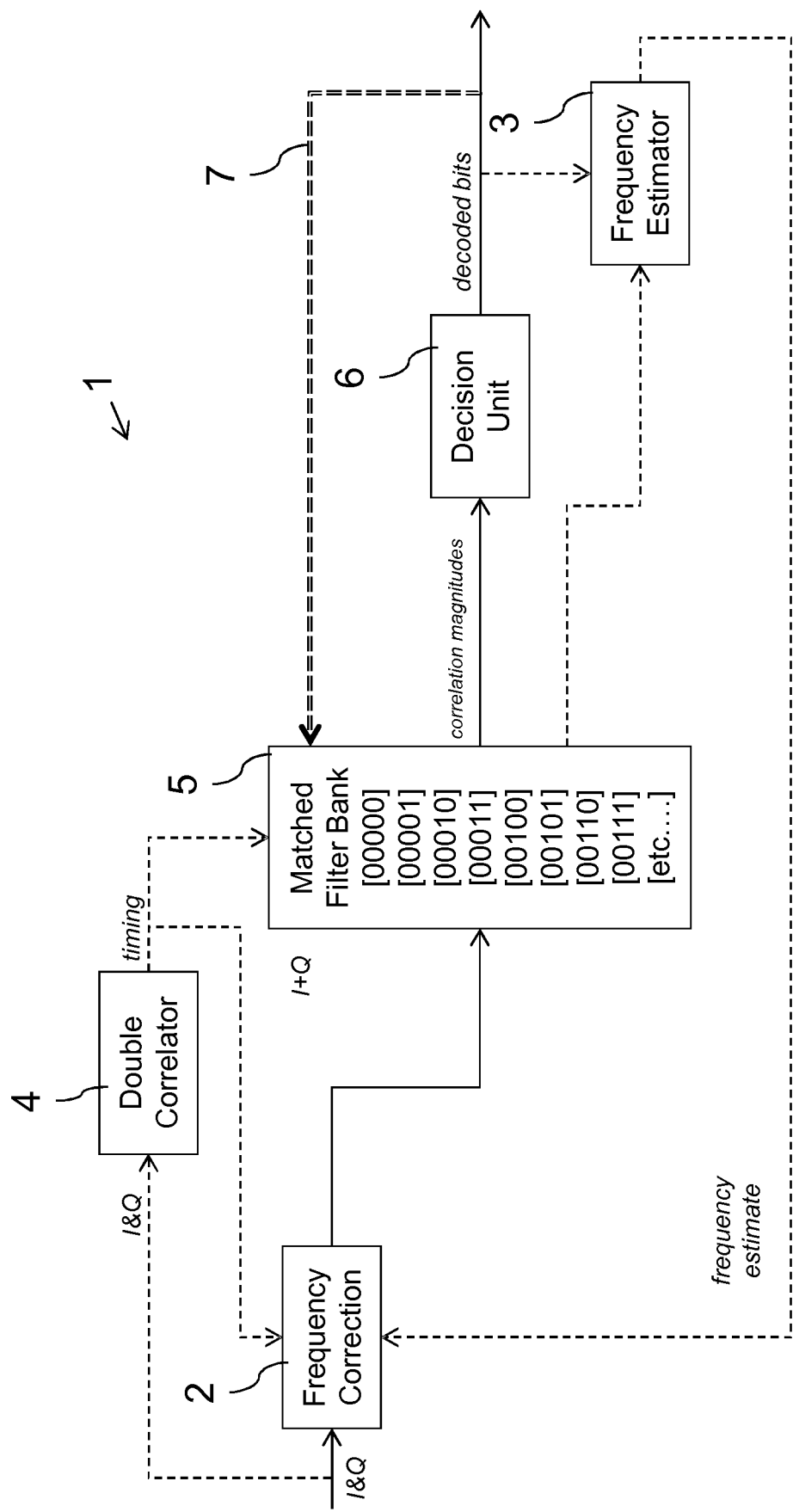
FIG. 1 is a schematic diagram of part of a digital radio receiver embodying the invention.

FIG. 1 shows part of a digital radio receiver 1 for receiving continuous-phase frequency-shift-key (FSK)-encoded signals. It may be a Bluetooth™ LE receiver. Conventional features such as an antenna, amplifiers, mixers, filters, analogue-to-digital converters, etc. are omitted for simplicity. These components generate a sampled radio signal from a received analogue radio signal, consisting of a sequence of complex-valued digital samples, I & Q, at baseband. The samples represent the received radio signal at a particular carrier frequency (e.g., in a band in the 2.4 GHz spectrum). The signal may be oversampled by a factor R. In the present examples, R=8, although it could take any suitable value.

The principal signal path through the components in FIG. 1 is shown with solid arrows, while paths that relate to control of timing and frequency corrections are shown with dashed arrows.

The complex baseband samples are first input to a frequency correction block 2, which performs complex rotation on the samples to compensate for any carrier-frequency offset, based on outputs from a frequency estimator 3 and from a double correlator unit 4.

The complex baseband samples are also fed to a double correlator unit 4 which performs an initial frequency offset as well as timing recovery and frame synchronization, by cross-correlating the received signal against a stored template, which corresponds to a fixed part of the preamble of any data packet that is intended for this radio receiver 1. The correlation is performed every sample. This timing information from the double correlator unit 4 is output to the frequency correction block 2 and to a matched filter bank 5. The frequency estimate needs to be relatively accurate (e.g., to within around 10 kHz) in order to avoid significant sensitivity degradation.

The matched filter bank 5, in addition to the timing information, also receives the frequency-corrected samples from the frequency correction block 2. The matched filter bank 5 contains a set of filters, each K bits long. In FIG. 1, K=5, but K may be 3, 4 or any other length. Each filter performs a complex cross-correlation between a respective filter sequence (a bit pattern) and the sampled signal.

At each time step, the matched filter bank 5 generates a set of complex correlation coefficients, one for each filter. It computes a real-valued modulus of each coefficient and outputs these correlation strength values to a decision unit 6.

The decision unit 6 receives this correlation-strength data and processes it to generate a sequence of decoded bits. This processing is described in more detail below. The decision unit 6 outputs a demodulated bit value at each bit period.

In some embodiments, the decoded bits are fed back to the matched filter bank along a feedback path 7. In such embodiments, these bits are used by the MFB 5 to define the filter sequences that the MFB 5 cross-correlates with the received samples. In other embodiments, however, no feedback to the MFB 5 is required; instead, decoded bits are fed back internally within the decision unit 6.

The complex correlation coefficients from the matched filter bank 5 are also sent to the frequency estimator 3, which uses them to estimate any frequency drift, which can influence the operation of the frequency correction block 2 on an on-going basis.

The decoded bit stream, output by the decision unit 6, may be stored in memory and/or processed further by the radio receiver 1 or another device, as appropriate.

Figure 2:
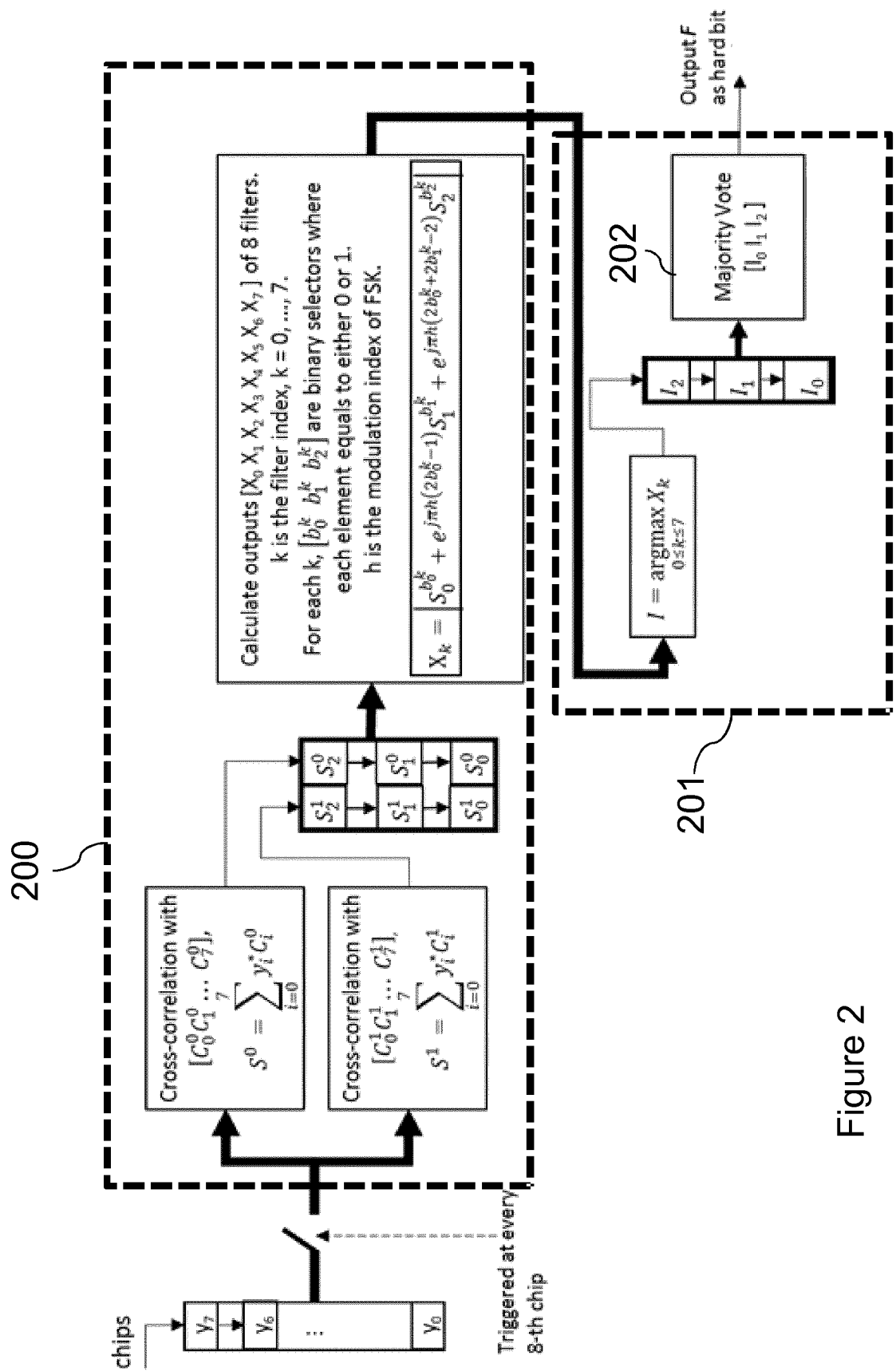
FIG. 2 is a schematic diagram of an MFB and decision unit that implement a conventional majority voting approach.

FIG. 2 illustrates the behaviour of a matched filter bank 200 and a decision unit 201 that implement a conventional majority-voting decoding approach. This is provided to help highlight the novel features of the embodiments shown in FIG. 3 and FIG. 4.

The MFB 200 uses a filter length of K=3.

A transmitted frequency shift key (FSK)-encoded radio signal, with modulation index h, and oversampling ratio R, can be defined as:

$$x_{nR+r} = x_{nR} \exp\left\{j\pi h \beta_n \frac{r}{R}\right\}$$

$$= \sqrt{P_x} \exp\left\{j\pi h \left(\beta_n \frac{r}{R} + \sum_{l=0}^{n-1} \beta_l\right)\right\}$$

where n indicates the current bit position; $\beta_l$ represent the successive bit values; $r \in [0, R-1]$ indexes the current sample offset (in time), from the symbol's timing anchor; and $P_x$ is the power at $x_0$. If the radio signal is binary-FSK modulated, the value $\beta_k$, for each k between 0 and n, represents the sign (i.e., −1 or 1) of the instantaneous phase shift corresponding to the $k^{th}$ bit in the bit stream $bit_k$; it can be formally defined as $\beta_k \triangleq 2.bit_k - 1$. The sum inside the exponential represents the accumulated phase offset of all the symbols leading up to the current symbol, accumulated over the whole bit stream thus far.

The received signal is then given by $$y_{nR+r} = h x_{nR+r} + \upsilon_{nR+r}$$

where h is a complex number representing the channel gain and phase, and $\upsilon_{nR+r}$ is a noise term.

The MFB 200 detects this received signal by non-coherently correlating the sampled radio signal with eight filters that have coefficients corresponding to the modulated signal for all possible 3-bit sequences. Each filter is indexed (labelled), with a unique reference, I. In some cases, the transmitted signal may employ pulse-shaping, such as Gaussian filtering. In such cases the model in equation (1) may not apply; however, it can still be possible for the coefficients of the MFB 200 to be based on equation (1) and successfully demodulate such a signal.

In general output of the MFB 200, at symbol time n, for a filter using fixed bit sequence $b=\{b_0, b_1, \ldots, b_{K-1}\}$, where the $b_i$'s here are the signs of the actual bits—i.e., representing the bits $\{0, 1\}$ as the values $\{-1, 1\}$ respectively—of the particular filter, is given by $$d_n(b) \triangleq \sum_{k=0}^{K-1} \sum_{r=0}^{R-1} y_{(n-(K-1)+k)R+r} \exp\left\{-j\pi h\left(b_k \frac{r}{R} + \sum_{l=0}^{k-1} b_l\right)\right\}$$

(The inner sum term over $b_i$ is defined to be zero when k=0.) The particular bit sequence b that maximizes $|d_n(b)|^2$ is the noncoherent maximum likelihood estimate.

The MFB 200 receives sample chips that have an up-sampling rate of eight—i.e., receiving eight samples $y_i$ for each bit. It cross-correlates each received set of eight chips with stored "zero"-bit filter coefficient $C_i^0$ and with stored "one"-bit filter coefficient $C_i^1$, to calculate complex correlation values $S^0$ and $S^1$ for each bit interval. The filter coefficients may correspond to the complex conjugate of the baseband representation of an FSK symbol with modulation index h, sampled at rate R, and an initial phase offset of 0 radians, corresponding to either a 0 or 1 bit, respectively.

These intermediate correlation results S are buffered for three time intervals, and are input to each of the eight filter modules. Each filter module, k=0, . . . , 7, uses these intermediate results to calculate a respective correlation magnitude value, $X_k$, representing a cross-correlation with a respective 3-bit filter sequence: [0 0 0], [0 0 1], [0 1 0], . . . , [1 1 1]. This is calculated as:

$$X_k = |S_0^{b_0^k} + e^{j\pi h(2b_0^k - 1)} S_1^{b_1^k} + e^{j\pi h(2b_0^k + 2b_1^k - 2)} S_2^{b_2^k}|$$

The eight correlation magnitude values, $X_k$, are then output to the decision unit 201. At each bit interval, the decision unit 201 identifies the index, I, of the filter sequence having the largest correlation magnitude. It then buffers three of these indices, over three time intervals, and uses majority voting logic 202 to decode the value of the one bit position that appears in all three filter sequences (at three different time offsets). This decoded binary value, F, is output as a hard bit in the decoded bit sequence.

Figure 3:
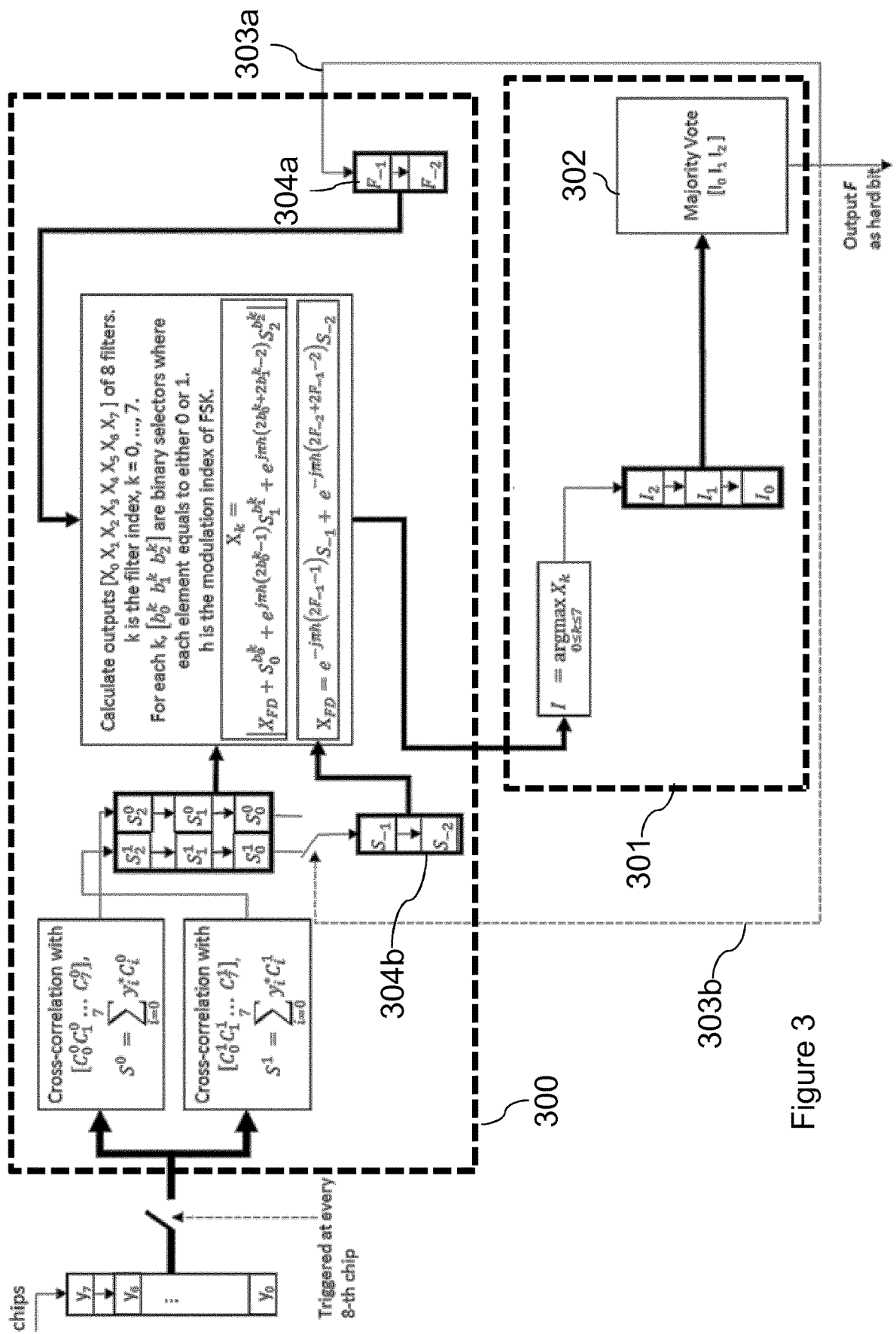
FIG. 3 is a schematic diagram of an MFB and decision unit that implement a first decoded-bit feedback method embodying the invention.
Figure 4:
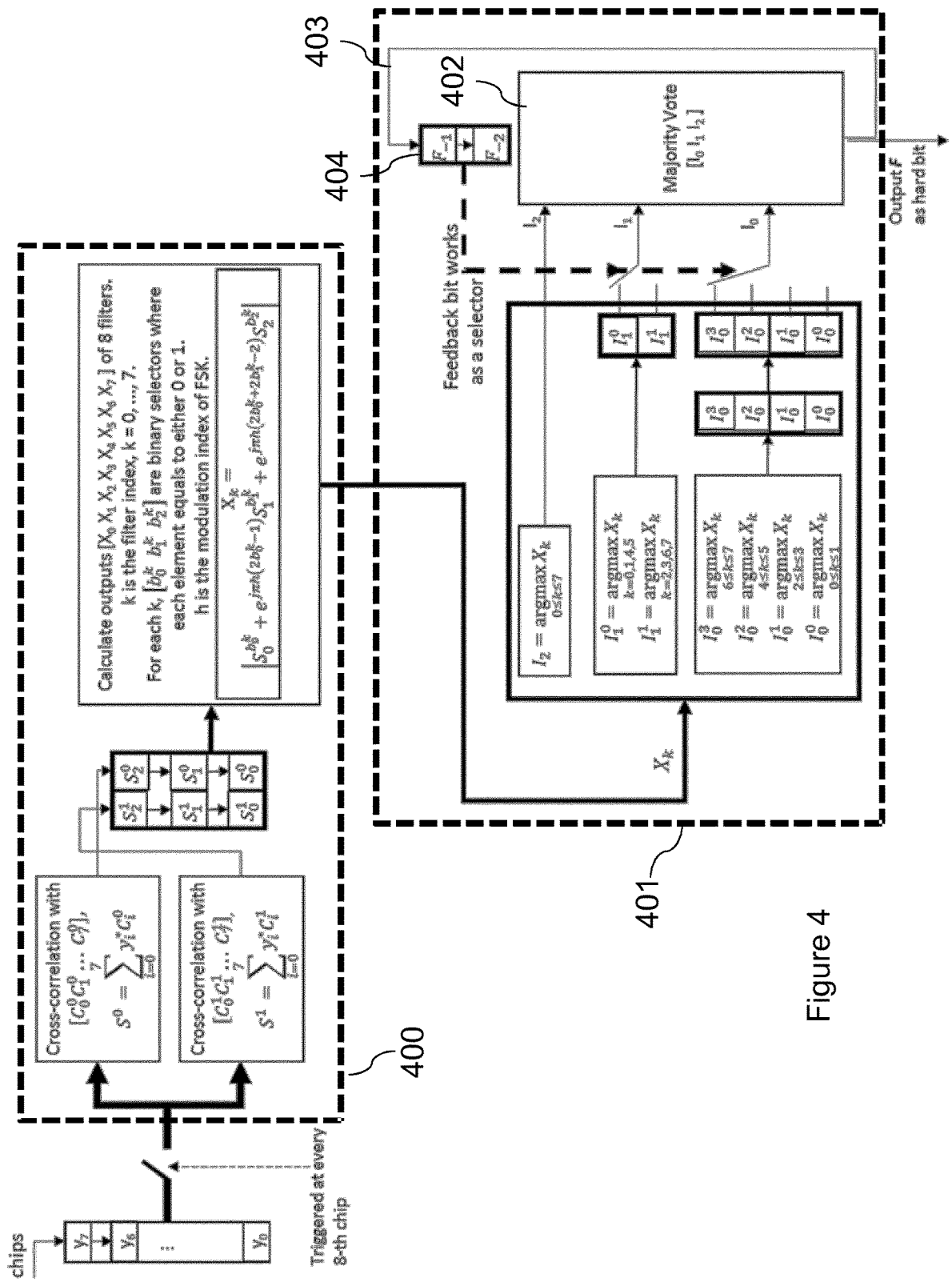
FIG. 4 is a schematic diagram of an MFB and decision unit that implement a second decoded-bit feedback method embodying the invention.

FIGS. 3 and 4 show two different embodiments of MFBs and decisions units that can be used in the receiver of FIG. 1. In both cases, the value of each bit in the sequence of output decoded bits is determined, in part, based on the values of two earlier decoded bits from the same sequence. This increases the sensitivity of the receivers.

In both cases, the decoding assumes that some bits before a current observation window have already been correctly decoded, and feeds these bits back to assist the decoding of the current bit. For example, if using two feedback bits, instead of calculating $d_n(b)$, a radio receiver embodying the invention might calculate $d_n([\hat{b}_{n-K-1}\ \hat{b}_{n-K}\ b])$ where $\hat{b}_{n-K-1}$ and $\hat{b}_{n-K}$ are outputs from a majority vote detector.

FIG. 3 shows a first embodiment of an MFB 300 and decision unit 301, for use in the receiver of FIG. 1, in which the value of each bit in the sequence of output decoded bits is determined, in part, based on the values of two earlier decoded bits from the same sequence. This is possible because of the addition of two feedback paths 303a, 303b.

This receiver arrangement provides improved performance, compared with that of FIG. 2, without significantly increasing the implementation complexity. The detector shown here has an effective filter length of K=5 (based on an underlying set of eight 3-bit filter sequences), but the idea can readily be extended to other values of K with minor modifications.

In this design, when decoding a current bit value, F, the two preceding hard bit outputs, $F_{-1}$ and $F_{-2}$ (which have already been calculated and output by the decision unit 301) are buffered and fed back to the MFB 300, which effectively appends these bits to the beginning of each of eight 3-bit filter sequences, to generate eight 5-bit filter sequences, against which the sampled signal is then correlated.

The two most recent output bits, $F_{-1}$ and $F_{-2}$, are sent along the feedback path 303a to be fed into the MFB 300, where they are saved in a two-bit shift register 304a. The latest output bit is also sent along a feedback path 303b as a control to a selector which selects one of the two latest intermediate correlation results S to write into a two-bit shift 304b, according to the value of the latest output bit value. These earlier decoded output bits, $F_{-1}$ and $F_{-2}$ (stored in buffer 304a) and their corresponding intermediate correlation results $S_{-1}$ and $S_{-2}$ (stored in buffer 304b) are used by the MFB 300 to calculate a value $X_{FD}$, which is in turn used by each filter module to generate the final outputs, $X_k$, of the eight filter modules, according to the following calculations:

$$X_k = |X_{FD} + S_0 b_0^k + e^{j\pi h(2b_0^k - 1)} S_1 b_1^k + e^{j\pi h(2b_0^k + 2b_1^k - 2)} S_2 b_2^k|$$

where $$X_{FD} = e^{-j\pi h(2F_{-1} - 1)} S_{-1} + e^{-j\pi h(2F_{-2} + 2F_{-1} - 2)} S_{-2}.$$

In simulations, this design has been found to achieve about 0.9 dB of additional gain, compared with the arrangement of FIG. 2, with K=5, a modulation index h=0.5, and using two feedback bits. However any combination of filter length and number of feedback bits is possible.

The decision unit 301 in FIG. 3 employs a majority vote detector 302; however any mechanism to generate a hard bit decision may be used.

FIG. 4 shows a second embodiment of an MFB 400 and decision unit 401, for use in the receiver of FIG. 1, in which the value of each bit in the sequence of output decoded bits is again determined, in part, based on the values of two earlier decoded bits from the same sequence. However, in contrast with FIG. 3, there is no feedback of decoded bits to the MFB 400, which applies a conventional bank of eight three-bit filters to the sampled signal. Instead, decoded bits pass along a feedback path 403 within the decision unit 401, in order to increase the effective range of the receiver beyond only three bits.

Rather than, at each bit interval, merely identifying the one filter, $I_2$, that has the largest correlation magnitude out of all eight filters and discarding the correlation magnitudes from the other filters, the decision unit 401 in FIG. 4 additionally identifies six further filter indices, $I_1^0$, $I_1^1$, $I_0^0$, $I_0^1$, $I_0^2$ and $I_0^3$, at each interval, representing filters having the largest correlation magnitude out of respective subsets of the eight filters. These candidate filters are resolved to two specific additional filters, $I_0$, $I_1$, for inputting to the majority-voting block 402, once two more bits have been decoded, before the current bit is decoded.

The buffered index $I_1$ has two possible values, one corresponding to the case that the hard decoded bit two positions before a particular "current" bit will be a zero—i.e., $F_{-1}=0$—and another corresponding to the case when $F_{-1}=1$. Similarly, the buffered index $I_0$ has four options, covering the four possible combinations of values of the two decoded bit values, $F_{-1}$ and $F_{-2}$, that immediately precede the current bit. These correspond to the cases $[F_{-2}\ F_{-1}]=[0\ 0]$, $[0\ 1]$, $[1\ 0]$ and $[1\ 1]$.

The filters could, of course, be indexed in any arbitrary way. However, assuming a natural binary-value indexing of the eight filters, k=0 to 7:

$I_1^0$ is the best-matched filter out of the four filters whose sequences have a zero in the first (earliest-received) bit position—i.e., in the set {[0 X Y], for X,Y=0 or 1}.

$I_1^0$ is the best-matched filter out of the four filters whose sequences have a one in the first bit position—i.e., in the set {[1 X Y], for X,Y=0 or 1}.

$I_0^0$ is the better-matched filter out of the two filters whose sequences are in {[0 0 X], for X=0 or 1}.

$I_0^1$ is the better-matched filter out of the two filters whose sequences are in {[0 1 X], for X=0 or 1}.

$I_0^2$ is the better-matched filter out of the two filters whose sequences are in {[1 0 X], for X=0 or 1}.

$I_0^3$ is the better-matched filter out of the two filters whose sequences are in {[1 1 X], for X=0 or 1}.

FIG. 5 shows this same information in tabular form.

FIG. 6 shows which of the buffered filter indices, $I_1^0$, $I_1^1$, $I_0^0$, $I_0^1$, $I_0^2$ and $I_0^3$, will then be input to the majority-vote block 402, through the selector switches in decision unit 401, as resolved indices $I_1$ and $I_0$, once the two bit positions immediately preceding the current bit have been decoded.

The majority-vote block 402 then uses the relevant bit position in each of the filter sequences corresponding to the resolved indices $I_1$ and $I_0$ to determine a current hard bit value, F, based on a majority vote across the three bit values, $I_0$, $I_1$ and $I_2$. It then outputs this bit value, F, and also sends it along the feedback path 403 to a two-bit shift-register 404, to serve as a selector for the decoding of the next two bit positions.

In this way, the decision unit 401 retains more information from each application of the filter bank. These filter indices are buffered for up to two bit intervals, and used to determine which of the filter sequences to input to a majority-vote block based on the values of the two feedback bits that are decoded during this buffer interval. In this way, additional correlation magnitude information is not simply discarded, but is used subsequently, once these two further bit decisions have been finalised, in inform the decoding of the current bit.

In simulations, this design has been found to achieve about 0.6 dB gain, compared with the arrangement of FIG. 2, with K=3, a modulation index h=0.5, and using two feedback bits.

It will be appreciated by those skilled in the art that the invention has been illustrated by describing one or more specific embodiments thereof, but is not limited to these embodiments; many variations and modifications are possible, within the scope of the accompanying claims. In particular, the filter sequences could be longer or shorter than is shown in these examples. If the sequences are an even number of bits long, then the majority vote may resolve a tie by an arbitrary selection or using any other suitable information. In some embodiments, the majority vote could be replaced by some other hard bit decision logic, such as a weighted vote, or it could be replaced with soft bit decision logic, e.g. based on the magnitude of the correlation value for the best filter where b=1 minus the correlation value for the best filter where b=0. The number of feedback bits could be larger or smaller than shown in these examples.

The invention claimed is:

1. A method of decoding data from a radio signal, the method comprising:
   applying a matched filter bank to a sampled radio signal to generate correlation-strength data, wherein each filter in the matched filter bank cross-correlates the sampled signal with data representing a respective filter sequence; and
   using the correlation-strength data to generate a sequence of decoded symbols from the sampled signal wherein the value of each symbol in the sequence of decoded symbols is determined in part based on the value of a respective earlier decoded symbol from the sequence of decoded symbols;
   wherein each filter sequence comprises a respective constant portion and a respective variable portion, the variable portion being positioned before the constant portion, wherein each constant portion is constant over time, and wherein each variable portion depends on one or more of the earlier decoded symbols;
   wherein the method further comprises at least one of the following:
   i) wherein, for each symbol in the sequence of decoded symbols, the respective earlier decoded symbol is offset from said symbol in time by a constant time offset; or
   ii) wherein, when determining the value of a symbol of the sequence of decoded symbols, the variable portions are all equal to a common sequence of one or more earlier decoded symbols; or
   iii) wherein the value of each symbol in the sequence of decoded symbols is determined in part based on the values of a plurality of respective earlier decoded symbols from the sequence of decoded symbols; or
   iv) wherein the constant portions across all the filter sequences of the matched filter bank contain every integer value from zero to the number of filters in the matched filter bank minus one; or
   v) wherein each symbol in the sequence of decoded symbols is decoded by applying the matched filter bank once, for each symbol, and identifying a best-matched filter, and decoding the symbol as the value in the filter sequence of the best-matched filter at a position corresponding to the symbol; or
   vi) applying the matched filter bank to the sampled signal a plurality of times, with different respective time offsets, when decoding each symbol, and a hard symbol decision block determining a symbol of the decoded sequence by receiving a best-matched filter for each of the plurality of time offsets and decoding the value of the symbol position in the decoded sequence by applying a decision process to a respective plurality of symbol values corresponding to the symbol position from across the plurality of best-matched filters.

2. The method of claim 1, wherein each filter sequence is two symbols or more in length.

3. The method of claim 1, wherein, for each symbol in the sequence of decoded symbols, the respective earlier decoded symbol is offset from said symbol in time by the constant time offset.

4. The method of claim 1, wherein, when determining the value of a symbol of the sequence of decoded symbols, the variable portions are all equal to the common sequence of one or more earlier decoded symbols.

5. The method of claim 1, wherein the value of each symbol in the sequence of decoded symbols is determined in part based on the values of a plurality of respective earlier decoded symbols from the sequence of decoded symbols.

6. The method of claim 1, wherein the constant portions across all the filter sequences of the matched filter bank contain every integer value from zero to the number of filters in the matched filter bank minus one.

7. The method of claim 1, wherein the variable portions in each filter sequence have a common length.

8. The method of claim 1, wherein each symbol in the sequence of decoded symbols is decoded by applying the matched filter bank once, for each symbol, and identifying the best-matched filter, and decoding the symbol as the value in the filter sequence of the best-matched filter at the position corresponding to the symbol.

9. The method of claim 1, comprising applying the matched filter bank to the sampled signal a plurality of times, with different respective time offsets, when decoding each symbol.

10. The method of claim 9, comprising the hard symbol decision block determining the symbol of the decoded sequence by receiving the best-matched filter for each of the plurality of time offsets and decoding the value of the symbol position in the decoded sequence by applying the decision process to the respective plurality of symbol values corresponding to the symbol position from across the plurality of best-matched filters.

11. The method of claim 1, comprising a soft symbol decision block using respective correlation-strength data from the plurality of matched filters to decode a symbol.

12. A radio receiver comprising:
   a matched filter bank comprising a plurality of filter modules for generating correlation-strength data from a sampled radio signal, each filter module being configured to cross-correlate the sampled signal with data representing a respective filter sequence, wherein each filter sequence comprises a respective constant portion and a respective variable portion, the variable portion being positioned before the constant portion, wherein each constant portion is constant over time;
   a decision unit configured to use the correlation-strength data to generate a sequence of decoded symbols from the sampled signal, wherein the matched filter bank and/or decision unit are configured to determine the value of each symbol in the sequence in part based on the value of a respective earlier decoded symbol from the sequence of decoded symbols; and one or more feedback paths from an output of the decision unit for feeding the value of the respective earlier decoded symbol back to the matched filter bank;

wherein each variable portion depends on one or more of the earlier decoded symbols received over said one or more feedback paths;

wherein the radio receiver further implements at least one of the following:

i) wherein the matched filter bank and/or decision unit are configured to determine the value of each symbol in the sequence of decoded symbols in part based on the values of a plurality of respective earlier decoded symbols from the sequence of decoded symbols; or ii) wherein the constant portions across all the filter sequences of the matched filter bank contain every integer value from zero to the number of filters in the matched filter bank minus one; or iii) wherein the variable portions in each filter sequence have a common length and, when determining the value of a symbol of the sequence of decoded symbols, are all equal to a same sequence of one or more earlier decoded symbols; or iv) wherein the radio receiver is configured to decode each symbol in the sequence of decoded symbols by applying the matched filter bank once, for each symbol, and identifying a best-matched filter, and by decoding the symbol as the value in the filter sequence of the best-matched filter at a position corresponding to the symbol; or v) wherein the radio receiver is configured to apply the matched filter bank to the sampled signal a plurality of times, with different respective time offsets, when decoding each symbol, and the radio receiver further comprises a hard symbol decision block configured to determine a symbol of the decoded sequence by receiving a best-matched filter for each of the plurality of time offsets and decoding the value of the symbol position in the decoded sequence by applying a decision process to a respective plurality of symbol values corresponding to the symbol position from across the plurality of best-matched filter.

13. The radio receiver of claim 12, wherein the matched filter bank and/or decision unit are configured to determine the value of each symbol in the sequence of decoded symbols in part based on the values of the plurality of respective earlier decoded symbols from the sequence of decoded symbols.

14. The radio receiver of claim 12, wherein the constant portions across all the filter sequences of the matched filter bank contain every integer value from zero to the number of filters in the matched filter bank minus one.

15. The radio receiver of claim 12, wherein the variable portions in each filter sequence have the common length and, when determining the value of the symbol of the sequence of decoded symbols, are all equal to a same sequence of one or more earlier decoded symbols.

16. The radio receiver of claim 12, configured to decode each symbol in the sequence of decoded symbols by applying the matched filter bank once, for each symbol, and identifying the best-matched filter, and by decoding the symbol as the value in the filter sequence of the best-matched filter at a position corresponding to the symbol.

17. The radio receiver of claim 12, configured to apply the matched filter bank to the sampled signal the plurality of times, with different respective time offsets, when decoding each symbol.

18. The radio receiver of claim 17, further comprising the hard symbol decision block, configured to determine the symbol of the decoded sequence by receiving the best-matched filter for each of the plurality of time offsets and decoding the value of the symbol position in the decoded sequence by applying the decision process to the respective plurality of symbol values corresponding to the symbol position from across the plurality of best-matched filter.

19. The radio receiver of claim 18, wherein the hard symbol decision block is a majority vote detector.

20. The radio receiver of claim 12, further comprising a soft symbol decision block, configured to use respective correlation-strength data from a plurality of matched filters to decode a symbol.

\* \* \* \* \*